United States Patent [19]
Choi

[11] Patent Number: 6,146,951
[45] Date of Patent: Nov. 14, 2000

[54] METHOD OF MANUFACTURING SEMICONDUCTOR DEVICE FOR PREVENTING ELECTROSTATIC DISCHARGE

[75] Inventor: Deuk Sung Choi, Songnam, Rep. of Korea

[73] Assignee: Hyundai Electronics Industries Co., Ltd., Kyoungki-do, Rep. of Korea

[21] Appl. No.: 09/103,751

[22] Filed: Jun. 24, 1998

[30] Foreign Application Priority Data

Jun. 25, 1997 [KR] Rep. of Korea ............. 97-27394

[51] Int. Cl.[7] ............................ H01L 21/336
[52] U.S. Cl. .................. 438/281; 438/202; 438/278; 257/349; 257/355; 257/173; 257/360
[58] Field of Search .................... 438/281, 202, 438/278; 257/349, 355, 173, 360

[56] References Cited

U.S. PATENT DOCUMENTS

| | | | |
|---|---|---|---|
| 4,409,726 | 10/1983 | Shiota | 29/571 |
| 5,369,041 | 11/1994 | Duvvury | 437/6 |
| 5,477,413 | 12/1995 | Watt | 361/56 |
| 5,554,544 | 9/1996 | Hsu | 437/55 |
| 5,675,168 | 10/1997 | Yamashita et al. | 257/355 |
| 5,777,368 | 7/1998 | Wu et al. | 257/360 |
| 5,898,193 | 4/1999 | Ham | 257/173 |
| 5,918,127 | 6/1999 | Lee et al. | 438/278 |
| 5,923,067 | 7/1999 | Voldman | 257/349 |
| 5,945,713 | 8/1999 | Voldman | 257/355 |
| 5,976,921 | 11/1999 | Maeda | 438/202 |

*Primary Examiner*—John F. Niebling
*Assistant Examiner*—Viktor Simkovic
*Attorney, Agent, or Firm*—Selitto & Associates

[57] ABSTRACT

A method of manufacturing a semiconductor device for preventing ESD damage is disclosed. A semiconductor device for preventing against ESD damage according to a first embodiment of the present invention, is fabricated as follows. Firstly, first impurity ions of a first conductivity type are implanted into a first region of a substrate of a semiconductor device using a first ion implantation, to form a first impurity ion layer. Here, a junction region will be formed in the first region and is connected to an input pad. Second impurity ions of the first conductivity type are then implanted into a second region of the substrate using a second ion implantation, to form a second impurity ion layer over the first ion impurity ion layer. Here, the second region includes the first region. Next, third impurity ions of a second conductivity type are implanted into the substrate of both sides of the first and second impurity ion layers, using a third ion implantation, to form a third impurity ion layer. The resultant structure is then annealed to form a first well for ESD of the first conductivity type and a second well of the second conductivity type. Here, the second well joins to the first well, and the upper edges of the first well is projected into the second well. Thereafter, junction regions of the first conductivity type of a high concentration are formed on the first and second wells.

10 Claims, 5 Drawing Sheets

METHOD OF MANUFACTURING SEMICONDUCTOR DEVICE FOR PREVENTING ELECTROSTATIC DISCHARGE

BACKGROUND OF THE INVENTION

1. Field of the Invention

The present invention relates to a method of manufacturing a semiconductor device, and more particularly to a method of manufacturing a semiconductor device for preventing against electrostatic discharge using a profiled well process.

2. Description of the Related Art

Electrostatic discharge (ESD) is one among factors determining reliability of a semiconductor chip. Such ESD is generated when handling the semiconductor chip and utilizing it in various applications and causes damage to the semiconductor chip. To protect the semiconductor chip from ESD damage, a protection circuit against ESD is provided along with the semiconductor chip.

FIG. 1 shows a conventional protection circuit against ESD. Referring to FIG. 1, a protection circuit against ESD 200 is inserted between an input pad 100 and an inside circuit 300. The protection circuit against ESD 200 includes a field transistor FD, a NMOS transistor NM connected to the field transistor FD in parallel, and a resistor R inserted between the field transistor FD and the NMOS transistor NM. The gate and drain of the field transistor FD are connected to the input pad 100, respectively and its source is connected to a power source VSS. The field transistor FD has a thick field oxide layer acting as a gate oxide layer. The drain of the field transistor FD is also an input portion of the protection circuit against ESD 200. The resistor R drops a voltage of the input pad 100 between the input pad 100 and the NMOS transistor NM. The resistor R is connected to the drains of the field transistor FD and of the NMOS transistor NM. The gate and source of the NMOS transistor NM are connected to the power source VSS.

In case ESD of a high voltage is generated at the input pad 100, the field transistor FD is turned on and it is prevented that the high voltage is applied to the inside circuit 300. On the other hand, in case ESD of a high voltage less than the power source VSS is generated at the input pad 100, the NMOS transistor NM is turned on and it is prevented that the high voltage is applied to the inside circuit 300.

FIG. 2 shows a cross sectional view of the field transistor FD of the protection circuit against ESD 200 in FIG. 1. Referring to FIG. 2, first, second, and third field oxide layers 21a, 21b, and 21c are formed on the semiconductor substrate 20 by a LOCOS (LOCal Oxidation of Silicon) technique. The second field oxide layer 21b between the first and third field oxide layers 21a and 21c, is a gate oxide layer. A N well for ESD 22 is formed in the substrate 20 on one side of the second field oxide layer 21b. A p well 23 is formed in the substrate 20 to join to the N well for ESD 22. A gate 24 is formed on the second field oxide layer 21b. First and second N+ junction regions 25a and 25b are formed in the N well for ESD 22 and the P well 23 on both sides of the gate 24, respectively. Here, the first N+ junction region 25a is a source and the second N+ junction region 25b is a drain which will be connected to the input pad 100 (refer to FIG. 1).

As above described, by the N well for ESD 22 under the second N+ junction region 25b, a leakage current due to a junction spiking caused by the ESD, is prevented and a breakdown voltage increases at a PN junction. As a result, the semiconductor chip is protected effectively from ESD generated at the input pad 100.

The N well for ESD 22 and the P well 23 are formed by a profiled well process that N type and P type impurity ions are implanted into the substrate 20 by a step-by-step ion implanting according to the depth of the substrate 20 and then an annealing is performed to diffuse the N type and P type impurity ions. At this time, the annealing is performed at a low temperature for a short time by the step-by-step ion implanting of the impurity ions, thereby decreasing a process time.

On the other hand, owing to a step-by-step distribution of impurity ions according to the depth of the substrate, the impurity concentration profile of the well is nonuniform. This concentration profile is further nonuniform at junction faces between the P well 23 and the N well for ESD 22 and between the second N+ junction region 25b and the N well for ESD 22, thereby generating a valley D to the N well for ESD 22, as shown in FIG. 2. The depth of The valley is further deep due to a counter doping caused by forming the P well 23. FIG. 3 shows impurity concentration distribution profile according to the depth of the substrate. As shown in FIG. 3, the profile is nonuniform at a depth X1 of the junction face of the second N+ junction region 25b and the N well for ESD 22 and at a depth X2 of the valley.

When operating the field transistor, an electric field concentrates at the valley, so that breakdown generates at the valley, firstly. As a result, current is crowded locally, so that the device is heated, thereby deteriorating the device. Furthermore, a junction spiking is generated at the second N+ junction region 25b due to the concentration of the electric field. Finally, the semiconductor chip is not effectively protected from ESD generated at the input pad 100, so that it is damaged.

SUMMARY OF THE INVENTION

It is therefore an object of the present invention to provide a method of manufacturing a semiconductor device for preventing ESD damage capable of decreasing well process time using a profiled well process, and effectively protecting a chip against ESD.

To accomplish this above object, a semiconductor device for preventing against ESD damage according to a first embodiment of the present invention, is fabricated as follows. Firstly, first impurity ions of a first conductivity type are implanted into a first region of a substrate of a semiconductor device using a first ion implantation, to form a first impurity ion layer. Here, a junction region will be formed in the first region and is connected to an input pad. Then, second impurity ions of the first conductivity type are implanted into a second region of the substrate using a second ion implantation, to form a second impurity ion layer over the first impurity ion layer. Here, the second region includes the first region. Next, third impurity ions of a second conductivity type are implanted into the substrate on both sides of the first and second impurity ion layers, using a third ion implantation, to form a third impurity ion layer. The resultant structure is then annealed to form a first well for ESD of the first conductivity type and a second well of the second conductivity type. Here, the second well joins to the first well, and the upper edges of the first well is projected into the second well. Thereafter, junction regions of the first conductivity type of a high concentration are formed on the first and second wells.

In the first embodiment, the second region has a larger area than the second region on the plane. The first and third ion implantation steps are performed respectively by a step-by-step implantation of the first and third impurity ions according to the depth of the substrate.

Furthermore, a semiconductor device for preventing against ESD damage according to a second embodiment of the present invention, is fabricated as follows. Firstly, first impurity ions of a first conductivity type are implanted into a first region of a semiconductor substrate using a first ion implantation, to form a first impurity ion layer. Here, a junction region will be formed in the first region and is connected to an input pad. Then, second impurity ions of a second conductivity type are implanted into a second region of the substrate using a second implantation, to form a second impurity ion layer. Here, the second region stands apart from the first region. Next, the resultant structure is annealed to form a first well for ESD of the first conductivity type and a second well of the second conductivity type. Here, the second well stands apart from the first well. Thereafter, junction regions of the first conductivity type of a high concentration are formed on the first and second well.

In the second embodiment, the first and second ion implantation steps are performed respectively by a step-by-step implantation of the first and second impurity ions according to the depth of the substrate.

Moreover, a semiconductor device for preventing against ESD damage according to a third embodiment of the present invention, is fabricated as follows. Firstly, a semiconductor substrate in which a first well for ESD of a first conductivity type and a second well of a second conductivity type are formed, is provided. Here, the first well is formed in a selected region of the substrate where a junction region will be formed. The junction region is connected to an input pad, and the first well joins to the second well, the upper edge of which is projected into the first well. Next, impurity ions of the first conductivity type of a high concentration are implanted on the portions of the first and second wells, respectively, to form impurity ion layers. The resultant structure is then annealed to form first and second junction regions on the first and second wells, respectively. Here, the first junction region substantially joins to the first well.

In the third embodiment, the impurity ion layer has a larger area than the first well on the plane. The first and second wells are respectively formed by a profiled well process.

DETAILED DESCRIPTION OF THE INVENTION

Hereinafter, preferred embodiments of the present invention will be explained in more detail with reference to the accompanying drawings.

Figure 4A:
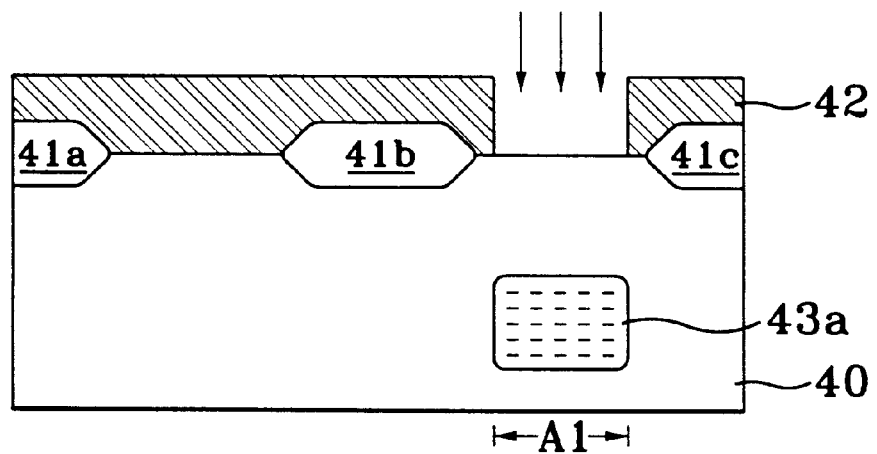
FIG. 4A, FIG. 4B, and FIG. 4C are cross sectional views showing a method of manufacturing a semiconductor device for protecting against ESD according to a first embodiment of the present invention.
Figure 4B:
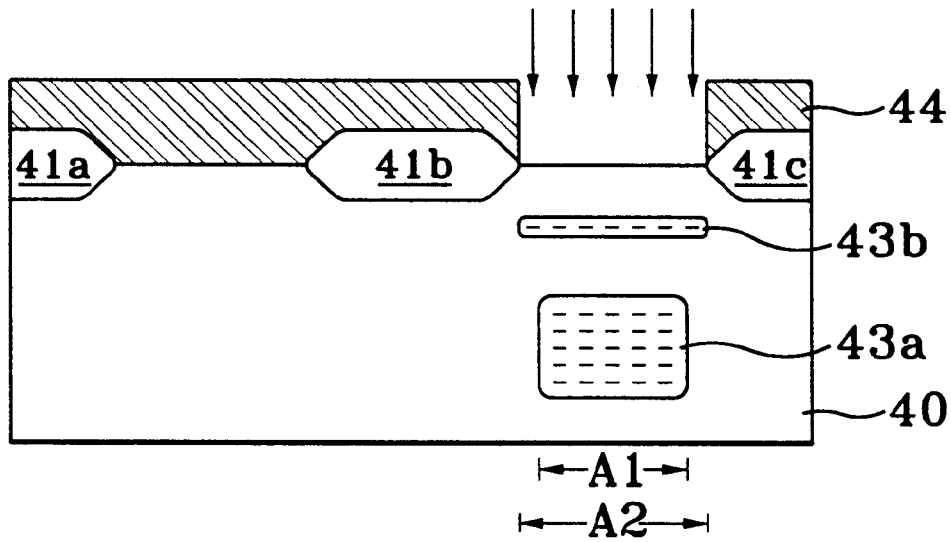
Figure 4C:
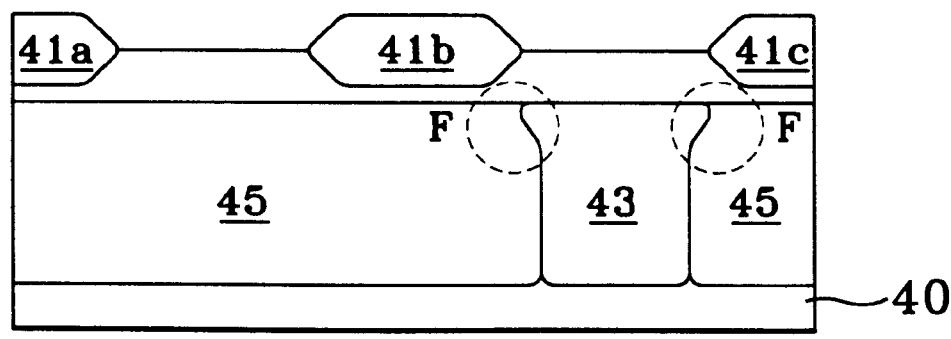

FIG. 4A, FIG. 4B, and FIG. 4C are cross sectional views showing a method of manufacturing a semiconductor device for protecting against ESD according to a first embodiment of the present invention.

Figure 1:
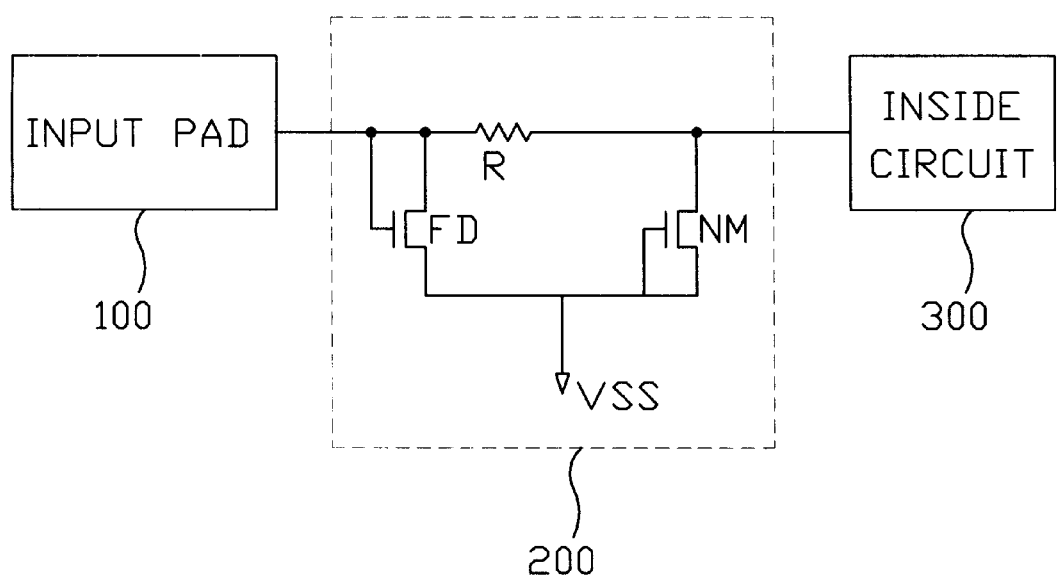
FIG. 1 shows a conventional protection circuit against ESD.
Figure 2:
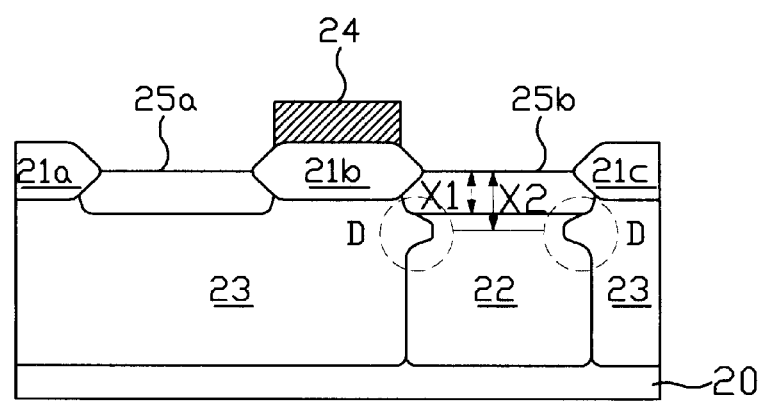
FIG. 2 shows a cross sectional view of a conventional semiconductor device for protecting against ESD.
Figure 3:
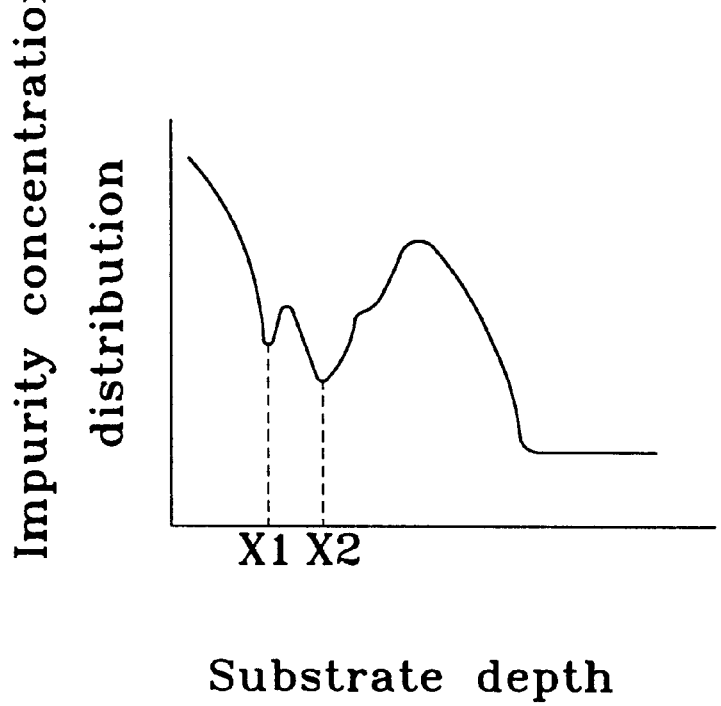
FIG. 3 shows the impurity concentration distribution profile of the semiconductor device for protecting against ESD in FIG. 2 according to the depth.

Referring to FIG. 4A, first, second, and third field oxide layers are formed on a semiconductor substrate 40 by a LOCOS(LOCal Oxidation of Silicon)technique. The second field oxide layer 41$b$ between the first and third field oxide layers 41$a$ and 41$c$, is a gate oxide layer of the field transistor FD(refer to FIG. 1). A first mask pattern 42 is formed on the substrate 40 by a photolithography to expose a first region A1 on one side of the second field oxide layer 41$b$. First N type impurity ions are implanted into the exposed first region A1 by a step-by-step ion implanting according to the depth of the substrate 40 using the first mask pattern 42 as an ion implantation mask, thereby forming a first N type impurity ion layer 43$a$.

Referring to FIG. 4B, the first mask pattern 42 is removed by a well-known method. A second mask pattern 44 is then formed on the substrate 40 by the photolithography to expose a second region A2 of the one side of the second field oxide layer 41$b$. The second region A2 includes (i.e., over laps) the first region A1 and has a larger area (i.e., lateral width) than the first region A1 on the plane. Second N type impurity ions are implanted into the second region A2 by ion implanting using the second mask pattern 44 as an ion implantation mask, thereby forming a second N type impurity ion layer 43$b$ over the first N type impurity ion layer 43$b$.

Referring to FIG. 4C, the second mask pattern 44 is removed by a well-known method. A third mask pattern (not shown) for a P well is then formed on the substrate 40 by the photography to expose the substrate except the first and second regions A1 and A2. P type impurity ions are implanted into the exposed substrate by the step-by-step ion implanting according to the depth of the substrate 40 using the third mask pattern as an ion implantation mask, thereby forming P type impurity ion layer (not shown). Thereafter, the third mask pattern is removed by a well-known method and then annealing is carried out at a low temperature for a short time. As a result, the ions of the P type impurity ion layer, the first and second N type impurity ion layers 43$a$ and 43$b$ (refer to FIG. 4B) are diffused, so that a N well for ESD 43 is formed on one side of the second field oxide layer 41$b$ and a P well 45 is formed in the substrate 40 to join the N well for ESD 43. At this time, owing to the second N type impurity ion layer 43$b$ implanted into the second region A2, the upper edges F of the N well for ESD 43 are projected into the P well 45, as shown in FIG. 4C.

Thereafter, as not shown in the drawings, a gate is formed on the second field oxide layer 41$b$ and then a first and second N$^+$ junction regions are formed on the P well 45 and the N well for ESD 43 on of both sides of the gate. Here, the first N$^+$ junction region is a source, and the second N$^+$ junction region is a drain which will be connected to the input pad 100 (refer to FIG. 1).

According to the above described first embodiment, owing to the second N type impurity ion layer 43$b$, the upper edges F of the N well for ESD 43 are projected into the P well 45, so that a valley is not generated to the N well for ESD 43 at the junction face between the P well 45 and the N well for ESD 43. As a result, local electric field is prevented due to the valley, so that a semiconductor chip is effectively protected from ESD generated at the input pad 100 (refer to FIG. 1).

Figure 5A:
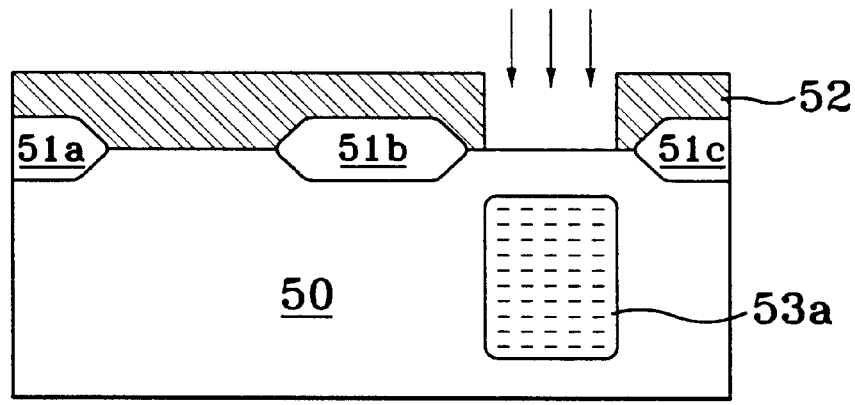
FIG. 5A, FIG. 5B, and FIG. 5C are cross sectional views showing a method of manufacturing a semiconductor device for protecting ESD according to a second embodiment of the present invention.
Figure 5B:
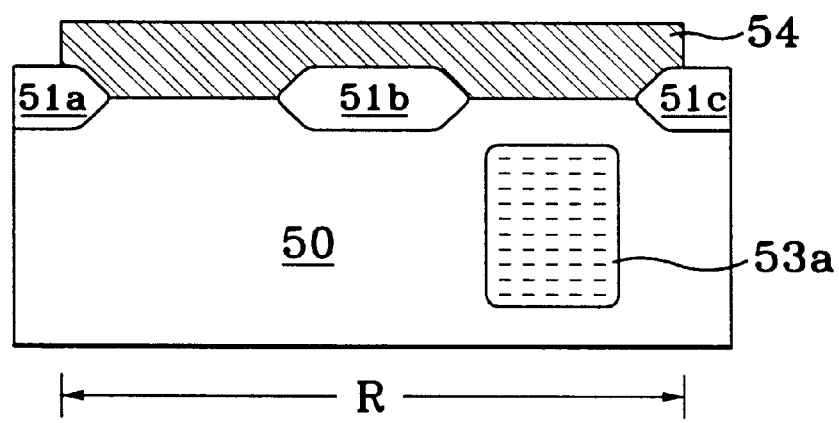
Figure 5C:
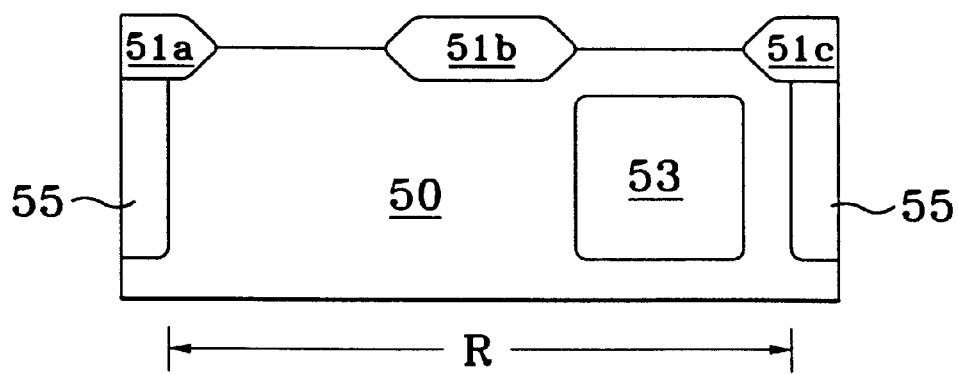

FIG. 5A, FIG. 5B, and FIG. 5C are cross sectional views showing a method of manufacturing a semiconductor device for protecting against ESD according to a second embodiment of the present invention.

Referring to FIG. 5A, first, second, and third field oxide layers 51a, 51b, and 51c are formed on a semiconductor substrate 50 by a LOCOS technique. The second field oxide layer 51b between the first and third field oxide layers 51a and 51c is a gate oxide layer of the field transistor FD(refer to FIG. 1). A first mask pattern 52 is formed on the substrate 50 by a photolithography to expose a region of one side of the second field oxide layer 51b. N type impurity ions are implanted into the exposed region by a step-by-step ion implanting according to the depth of the substrate 50 using the first mask pattern 52 as an ion implantation mask, thereby forming a N type impurity ion layer 53a.

Referring to FIG. 5B, the first mask pattern 52 is removed by a well-known method. A second mask pattern 54 for a P well is then formed on the substrate 50 by the photolithography to mask a field transistor region R.

Referring to FIG. 5C, P type impurity ions are implanted into the exposed substrate by the step-by-step ion implanting according to the depth of the substrate 50 using the second mask pattern 54 as an ion implantation mask, thereby forming a P type impurity ion layer (not shown). Thereafter, the second mask pattern 54 of FIG. 5b is removed by a well-known method and then annealing is carried out at a low temperature for a short time. As a result, the ions of the P type impurity ion layer and the N type impurity ion layer 53a (refer to FIG. 5B) are diffused, so that a N well for ESD 53 and a P well 55 are formed, respectively.

Thereafter, as not shown in the drawings, a gate is formed on the second field oxide layer 51b and then a first and second N$^+$ junction regions are formed at both sides of the gate. Here, the first N$^+$ junction region is a source, and the second N$^+$ junction region is a drain which will be connected to the input pad 100 (refer to FIG. 1).

According to the above described second embodiment, since the P well is not formed in the field transistor region R, the junction face is not formed between the N well for ESD 53 and the P well 55, so that a valley is not generated to the N well for ESD 53. Furthermore, since the field transistor region R is masked by the second mask pattern 54, a counter doping is prevented. As a result, local electric field is prevented due to the valley, so that a semiconductor chip is effectively protected from ESD generated at the input pad 100 (refer to FIG. 1). Moreover, since the P well 55 is not formed in the field transistor region R, the channel length of the field transistor of this embodiment is given so that it has a longer channel length than the field transistor FD of a conventional field transistor, thereby preventing a leakage current.

Figure 6A:
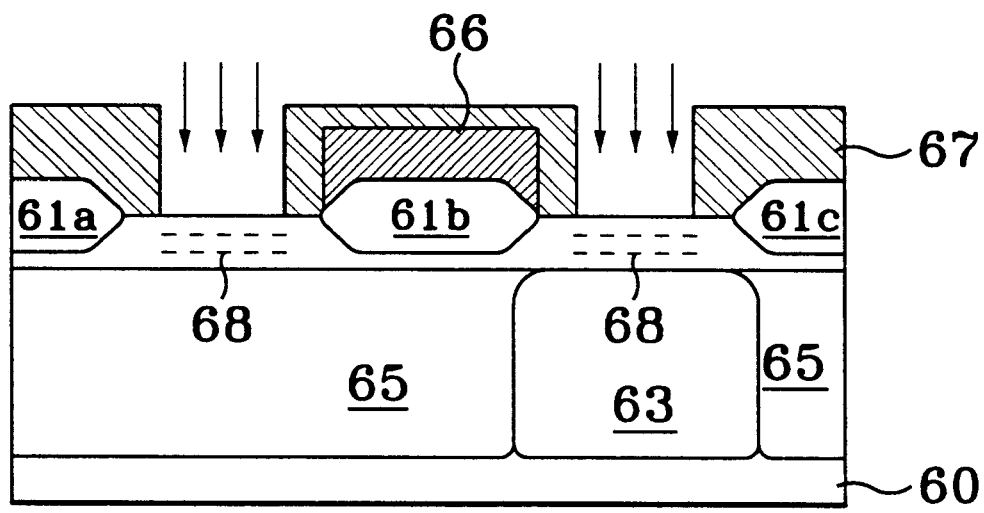
FIG. 6A and FIG. 6B are cross sectional views showing a method of manufacturing a semiconductor device for protecting against ESD according to a third embodiment of the present invention.
Figure 6B:
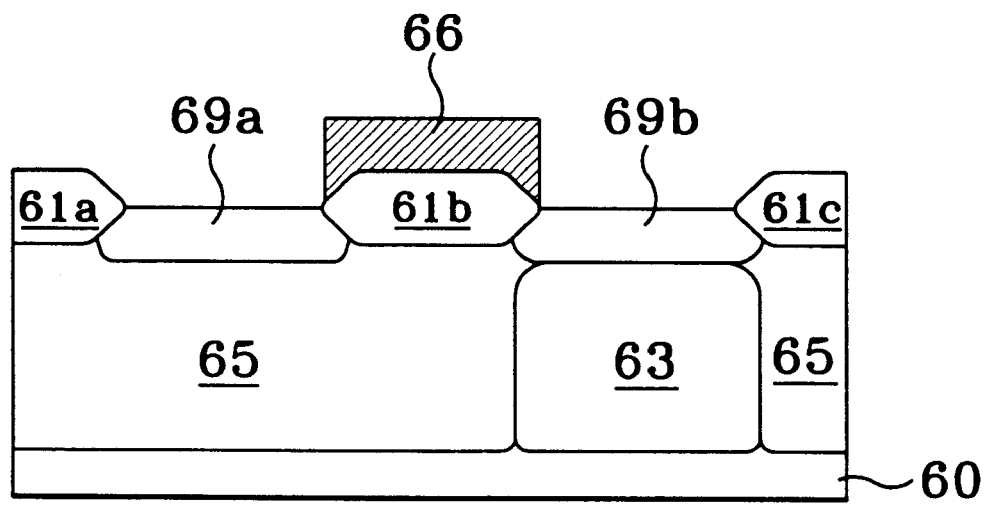

FIG. 6A, and FIG. 6B are cross sectional views showing a method of manufacturing a semiconductor device for preventing ESD damage according to a third embodiment of the present invention.

Referring to FIG. 6A, first, second, and third field oxide layers 61a, 61b, and 61c are formed on a semiconductor substrate 60 by a LOCOS technique. The second field oxide layer 61b between the first and third field oxide layers 61a and 61c is a gate oxide layer of the field transistor FD(refer to FIG. 1). A first mask pattern is formed on the substrate 60 by a photolithography to expose a region of one side of the second field oxide layer 61b. N type impurity ions are implanted into the exposed region by a step-by-step ion implanting according to the depth of the substrate 60 using the first mask pattern as an ion implantation mask, thereby forming a N type impurity ion layer (not shown). The first mask pattern is removed by a well-known method. A second mask pattern(not shown) for a P well is then formed on the substrate 60 by the photolithography. P type impurity ions are implanted into the exposed substrate by the step-by-step ion implanting according to the depth of the substrate 60 using the second mask pattern as an ion implantation mask, thereby forming a P type impurity ion layer (not shown).

Thereafter, the second mask pattern is removed by a well-known method and then annealing is carried out at a low temperature for a short time. As a result, the ions of the P type impurity ion layer and the N type impurity ion layer are diffused, so that a N well for ESD 63 is formed in one side of the second field oxide layer 61b and a P well 65 is formed in the substrate 60 to join the N well for ESD 63. At this time, the upper edges of the P well 65 are projected into the N well for ESD 63, so that a negative impurity concentration profile appears on an upper junction face between the N well for ESD 63 and the P well 65.

Next, a third mask pattern 67 is formed on the substrate 60 to expose portions of the P well 65 and the N well for ESD 63. At this time, the exposed portion have a smaller area than the N well for ESD 63 on the plane. N$^+$ impurity ions are implanted into the exposed portions, thereby forming N$^+$ impurity ion layers 68.

Referring to FIG. 6B, the second mask pattern 67 is removed and annealing is preformed, thereby forming first and second N$^+$ junction regions 69a and 69b. At this time, the second N$^+$ junction region 69b is joined to the upper surface of the N well for ESD 63. Here, the first N$^+$ junction region 69a is a source, and the second N$^+$ junction region 69b is a drain which will be connected to the input pad 100 (refer to FIG. 1).

According to the above described third embodiment, although the negative impurity concentration profile appears at the upper junction face between the N well for ESD 63 and the P well 65, the N$^+$ impurity ions are not implanted in the junction by the third mask pattern 67. As a result, a valley is not generated to the N well for ESD 63. Accordingly, local electric field is prevented due to the valley, so that a semiconductor chip is effectively protected from ESD generated at the input pad 100 (refer to FIG. 1).

According to the present invention, when performing a profiled well process, by transforming ion implantation masks for a N well for ESD and a P well, a valley is not generated to the N well for ESD. Furthermore, by transforming ion implantation mask for junction regions, a valley is not generated to the N well for ESD. Accordingly, well process time decreases by the profiled well process and local electric field is prevented due to the valley, so that a semiconductor chip is effectively protected from ESD.

Although the preferred embodiments of this invention have been disclosed for illustrative purpose, those skilled in the art will appreciate that various modifications, additions and substitutions are possible, without departing from the scope and spirit of the invention as described in the accompanying claims.

What is claimed is:

1. A method of manufacturing a semiconductor device adapted to be inserted between an input pad and an inside circuit for protection against an electrostatic discharge generating from the input pad, said method comprising the steps of:

implanting first impurity ions of a first conductivity type into a substrate so as to form a first impurity ion layer below a location at which a junction region connected to the input pad is to be formed;

implanting second impurity ions of the first conductivity type into said substrate so as to form a second impurity ion layer interposed between said first impurity ion layer and said location, said first impurity ion layer being overlapped laterally with said second impurity ion layer;

implanting third impurity ions of a second conductivity type into said substrate so as to form third impurity ion layers, each of which is located on a lateral side of said first and second impurity ion layers; and forming a first well and second wells from said first and second impurity ion layers and said third impurity ion layers, respectively, through an annealing process such that said first well is formed with upper edges, each of which projects laterally outwardly into a corresponding one of said second wells.

2. A method of manufacturing a semiconductor device adapted to be inserted between an input pad and an inside circuit for protection against an electrostatic discharge generating from the input pad, said method comprising the steps of:

implanting first impurity ions of a first conductivity type into a first region of a substrate so as to form a first impurity ion layer therein below a first location at which a first junction region connected to the input pad is to be formed, said first region spanning laterally between said first location and a second location at which a second junction region connected to an associated power source is to be formed;

implanting second impurity ions of a second conductivity type into a second region of said substrate so as to form a second impurity ion layer therein, said second region being located laterally outwardly from said first region; and annealing said substrate so as to form a first well from said first impurity ion layer for preventing electrostatic discharge damage and so as to form a second well from said second impurity ion layer, said second well being confined to said second region such that it is located apart from said first well and such that it is not adjoined with said first well.

3. A method of manufacturing a semiconductor device adapted to be inserted between an input pad and an inside circuit for protection against an electrostatic discharge generating from the input pad, said method comprising the steps of:

providing a substrate having therein a first well of a first conductivity type for preventing electrostatic discharge damage and a second well of a second conductivity type, said first well being adjoined with said second well such that an upper edge of said second well projects laterally outwardly into said first well;

implanting impurity ions of the first conductivity type of a high concentration into said substrate so as to form first and second impurity ion layers directly above said first and second wells, respectively, without implanting said impurity ions into said upper edge; and annealing said substrate so as to form first and second junction regions from said first and second impurity ion layers, respectively, said first junction region being adjoined to said first well and connected to the input pad.

4. The method of claim 1, wherein said second impurity ion layer is formed with a lateral width greater than that of said first impurity ion layer during said second impurity ion implanting step.

5. The method of claim 4, further comprising the steps of forming a first mask pattern on said substrate prior to said first impurity ion implanting step so as to expose a first region of said substrate such that said first impurity ions can be implanted into said first region during said first impurity ion implanting step; and forming a second mask pattern on said substrate prior to said second impurity ion implanting step so as to expose a second region of said substrate such that said second impurity ions can be implanted into said second region during said second impurity ion implanting step, said first region being overlapped laterally with said second region and having a lateral width smaller than that of said second region.

6. The method of claim 2, further comprising the steps of forming a first mask pattern on said substrate prior to said first impurity ion implanting step so as to expose a third region of said substrate such that said first impurity ions can be implanted into said third region during said first impurity ion implanting step, said third region being contained within said first region; and forming a second mask pattern on said substrate prior to said second impurity ion implanting step so as to expose said second region without exposing said first region and said third region.

7. The method of claim 3, further comprising the step of forming a mask pattern on said substrate prior to said impurity ion implanting step so as to laterally cover said upper edge such that said impurity ions are inhibited from being implanted into said upper edge during said impurity ion implanting step.

8. The method of claim 1, further comprising the steps of forming junction regions of the first conductivity type of a high concentration on the first and second wells.

9. The method of claim 2, further comprising the steps of forming junction regions of the first conductivity type of a high concentration on the first and second well.

10. The method of claim 2, wherein the first and second ion implantation steps are performed by a step-by-step implantation of the first and second impurity ions, respectively, based upon the depth of the substrate.

* * * * *